(12) United States Patent
Salter et al.

(10) Patent No.: US 8,454,181 B2
(45) Date of Patent: Jun. 4, 2013

(54) LIGHT BAR PROXIMITY SWITCH

(75) Inventors: Stuart C. Salter, White Lake, MI (US);
Denis Patrick Igoe, Livonia, MI (US);
Jeffrey Singer, Canton, MI (US);
Cornel Lewis Gardner, Romulus, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 422 days.

(21) Appl. No.: 12/868,494

(22) Filed: Aug. 25, 2010

(65) Prior Publication Data
US 2012/0048708 A1    Mar. 1, 2012

(51) Int. Cl.
*G01D 13/20* (2006.01)
*G01D 13/02* (2006.01)

(52) U.S. Cl.
USPC ............................................. 362/26; 362/158

(58) Field of Classification Search
USPC ................................................... 362/26, 158
See application file for complete search history.

(56) References Cited

U.S. PATENT DOCUMENTS

| | | | |
|---|---|---|---|
| 3,382,588 A | 5/1968 | Serrell et al. | |
| 3,826,979 A | 7/1974 | Steinmann | |
| 4,257,117 A | 3/1981 | Besson | |
| 4,290,052 A | 9/1981 | Eichelberger et al. | |
| 4,413,252 A | 11/1983 | Tyler et al. | |
| 4,613,802 A | 9/1986 | Kraus et al. | |
| 4,743,895 A | 5/1988 | Alexander | |
| 4,748,390 A | 5/1988 | Okushima et al. | |
| 4,758,735 A | 7/1988 | Ingraham | |
| 4,821,029 A | 4/1989 | Logan et al. | |
| 4,872,485 A | 10/1989 | Laverty, Jr. | |
| 4,899,138 A | 2/1990 | Araki et al. | |
| 4,924,222 A | 5/1990 | Antikidis et al. | |
| 4,972,070 A | 11/1990 | Laverty, Jr. | |
| 5,025,516 A | 6/1991 | Wilson | |
| 5,033,508 A | 7/1991 | Laverty, Jr. | |

(Continued)

FOREIGN PATENT DOCUMENTS

| | | |
|---|---|---|
| EP | 1562293 | 8/2005 |
| GB | 2409578 | 6/2005 |

(Continued)

OTHER PUBLICATIONS

"Touch Sensors Design Guide" by ATMEL, 10620 D-AT42-04/09, Revised Apr. 2009, 72 pages, Copyrighted 2008-2009 Atmel Corporation.

(Continued)

*Primary Examiner* — Karabi Guharay
*Assistant Examiner* — Nathaniel Lee
(74) *Attorney, Agent, or Firm* — Vichit Chea; Price Heneveld LLP

(57) ABSTRACT

A light bar proximity switch is provided that includes a light pipe having a first surface and a second surface, wherein the first and second surface define an area. The light bar proximity sensor further includes an at least partially reflective surface adjacent the second surface, at least one circuit board spaced from the light pipe and the at least partially reflective surface, at least one proximity sensor electrically connected to the at least one circuit board, and at least one light source configured to project light along the area, wherein the emitted light is reflected by the at least partially reflective surface and viewed through the first surface.

22 Claims, 2 Drawing Sheets

U.S. PATENT DOCUMENTS

| | | | |
|---|---|---|---|
| 5,159,159 A | 10/1992 | Asher | |
| 5,239,152 A | 8/1993 | Caldwell et al. | |
| 5,270,710 A | 12/1993 | Gaultier et al. | |
| 5,451,724 A | 9/1995 | Nakazawa et al. | |
| 5,467,080 A | 11/1995 | Stoll et al. | |
| 5,477,422 A * | 12/1995 | Hooker et al. | 362/29 |
| 5,566,702 A | 10/1996 | Philipp | |
| 5,572,205 A | 11/1996 | Caldwell et al. | |
| 5,598,527 A | 1/1997 | Debrus et al. | |
| 5,670,886 A | 9/1997 | Wolff et al. | |
| 5,730,165 A | 3/1998 | Philipp | |
| 5,747,756 A | 5/1998 | Boedecker | |
| 5,760,554 A | 6/1998 | Bustamante | |
| 5,790,107 A | 8/1998 | Kasser et al. | |
| 5,796,183 A | 8/1998 | Hourmand | |
| 5,917,165 A | 6/1999 | Platt et al. | |
| 5,920,309 A | 7/1999 | Bisset et al. | |
| 5,942,733 A | 8/1999 | Allen et al. | |
| 5,973,417 A | 10/1999 | Goetz et al. | |
| 5,973,623 A | 10/1999 | Gupta et al. | |
| 6,010,742 A | 1/2000 | Tanabe et al. | |
| 6,011,602 A | 1/2000 | Miyashita et al. | |
| 6,040,534 A | 3/2000 | Beukema | |
| 6,157,372 A | 12/2000 | Blackburn et al. | |
| 6,288,707 B1 | 9/2001 | Philipp | |
| 6,320,282 B1 | 11/2001 | Caldwell | |
| 6,323,919 B1 | 11/2001 | Yang et al. | |
| 6,377,009 B1 | 4/2002 | Philipp | |
| 6,379,017 B2 | 4/2002 | Nakabayashi et al. | |
| 6,452,514 B1 | 9/2002 | Philipp | |
| 6,466,036 B1 | 10/2002 | Philipp | |
| 6,529,125 B1 | 3/2003 | Butler et al. | |
| 6,535,200 B2 | 3/2003 | Philipp | |
| 6,559,902 B1 | 5/2003 | Kusuda et al. | |
| 6,614,579 B2 | 9/2003 | Roberts et al. | |
| 6,654,006 B2 | 11/2003 | Kawashima et al. | |
| 6,661,410 B2 | 12/2003 | Casebolt et al. | |
| 6,664,489 B2 | 12/2003 | Kleinhans et al. | |
| 6,713,897 B2 | 3/2004 | Caldwell | |
| 6,734,377 B2 | 5/2004 | Gremm et al. | |
| 6,738,051 B2 | 5/2004 | Boyd et al. | |
| 6,773,129 B2 | 8/2004 | Anderson, Jr. et al. | |
| 6,819,316 B2 | 11/2004 | Schulz et al. | |
| 6,891,530 B2 | 5/2005 | Umemoto et al. | |
| 6,897,390 B2 | 5/2005 | Caldwell et al. | |
| 6,940,291 B1 | 9/2005 | Ozick | |
| 7,030,513 B2 | 4/2006 | Caldwell | |
| 7,053,360 B2 | 5/2006 | Balp et al. | |
| 7,091,886 B2 | 8/2006 | DePue et al. | |
| 7,151,532 B2 | 12/2006 | Schulz | |
| 7,154,481 B2 | 12/2006 | Cross et al. | |
| 7,180,017 B2 | 2/2007 | Hein | |
| 7,186,936 B2 | 3/2007 | Marcus et al. | |
| 7,215,529 B2 | 5/2007 | Rosenau | |
| 7,218,498 B2 | 5/2007 | Caldwell | |
| 7,232,973 B2 | 6/2007 | Kaps et al. | |
| 7,242,393 B2 | 7/2007 | Caldwell | |
| 7,248,151 B2 | 7/2007 | McCall | |
| 7,248,955 B2 | 7/2007 | Hein et al. | |
| 7,254,775 B2 | 8/2007 | Geaghan et al. | |
| 7,255,622 B2 | 8/2007 | Stevenson et al. | |
| 7,339,579 B2 | 3/2008 | Richter et al. | |
| 7,342,485 B2 | 3/2008 | Joehl et al. | |
| 7,361,860 B2 | 4/2008 | Caldwell | |
| 8,330,385 B2 | 12/2012 | Salter et al. | |
| 2002/0149376 A1 * | 10/2002 | Haffner et al. | 324/635 |
| 2002/0167439 A1 | 11/2002 | Bloch et al. | |
| 2002/0167704 A1 | 11/2002 | Kleinhans et al. | |
| 2004/0056753 A1 | 3/2004 | Chiang et al. | |
| 2006/0082545 A1 | 4/2006 | Choquet et al. | |
| 2007/0051609 A1 | 3/2007 | Parkinson | |
| 2008/0023715 A1 * | 1/2008 | Choi | 257/98 |
| 2008/0030465 A1 * | 2/2008 | Konet et al. | 345/158 |
| 2008/0202912 A1 | 8/2008 | Boddie et al. | |
| 2008/0257706 A1 | 10/2008 | Haag | |
| 2008/0272623 A1 | 11/2008 | Kadzban et al. | |
| 2009/0108985 A1 | 4/2009 | Haag et al. | |

FOREIGN PATENT DOCUMENTS

| | | |
|---|---|---|
| GB | 2418741 | 4/2006 |
| JP | 07315880 | 12/1995 |
| JP | 08138446 | 5/1996 |
| JP | 11065764 | 3/1999 |
| JP | 11316553 | 11/1999 |
| JP | 2000047178 | 2/2000 |
| JP | 2000075293 | 3/2000 |
| WO | 9963394 | 12/1999 |
| WO | 2007022027 | 2/2007 |
| WO | 2008121760 | 10/2008 |

OTHER PUBLICATIONS

Smart Touch® Keypad Design Guide, Keypad Part No. 1310674, Natron Corporation, Found at: http://www.nartron.com/?p=pdfviewer&file=host/nartron/File/SmartTouch.pdf.

ATMEL™ Touch Sensor Design Guide, 10620D-AT42-04/09.

* cited by examiner

LIGHT BAR PROXIMITY SWITCH

FIELD OF THE INVENTION

The present invention generally relates to a proximity switch, and more particularly, a light bar proximity switch.

BACKGROUND OF THE INVENTION

Typically, various vehicle components require switches, such as, switches for operating windows, headlights, windshield wipers, moon roofs, and radios. Generally, these types of switches need to be actuated in order to activate or deactivate the device or perform another type of control function. Thus, the switches themselves clearly indicate the type of actuation that is needed to create such a control signal. Such switches can be labeled by laser etching or pad printing, which typically requires an additional manufacturing step, and such labels can be worn off throughout use of the switch.

SUMMARY OF THE INVENTION

Accordingly, in a first disclosed embodiment, a light bar proximity switch is provided that includes a light pipe having a first surface and a second surface, wherein the first and second surface define an area. The light bar proximity switch further includes an at least partially reflective surface adjacent the second surface, at least one circuit board spaced from the light pipe and the at least partially reflective surface, at least one proximity sensor electrically connected to the at least one circuit board, and at least one light source configured to project light along the area, wherein the emitted light is reflected by the at least partially reflective surface and viewed through the first surface.

In another disclosed embodiment, a light bar proximity switch is provided that includes a light pipe having a first surface and a second surface, wherein the first and second surface define an area. The light bar proximity switch further includes an at least partially reflective surface adjacent the second surface, wherein the at least partially reflective surface includes at least one image, at least one circuit board spaced from the light pipe and the at least partially reflective surface, at least one capacitive sensor electrically connected to the at least one circuit board, and at least one light source configured to project light of multiple colors along the area, wherein the emitted light is reflected by the at least partially reflective surface and viewed through the first surface.

In another disclosed embodiment, a light bar proximity switch integrated in a vehicle is provided. The light bar proximity switch includes a light pipe, an at least partially reflective surface having an image and adjacent the light pipe, at least one capacitive sensor spaced from the light pipe, and at least one light source configured to project light of multiple colors that is reflected by the at least partially reflective surface and viewed through the light pipe.

These and other aspects, objects, and features of the present invention will be understood and appreciated by those skilled in the art upon studying the following specification, claims, and appended drawings.

DETAILED DESCRIPTION OF PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
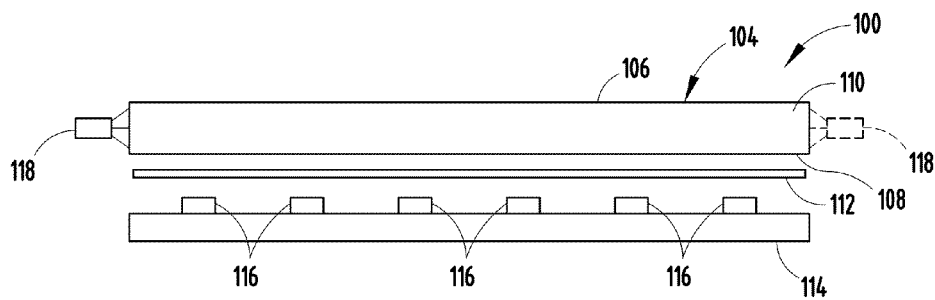
FIG. 1 is a schematic diagram of a light bar proximity switch, in accordance with one embodiment of the present invention.
Figure 2:
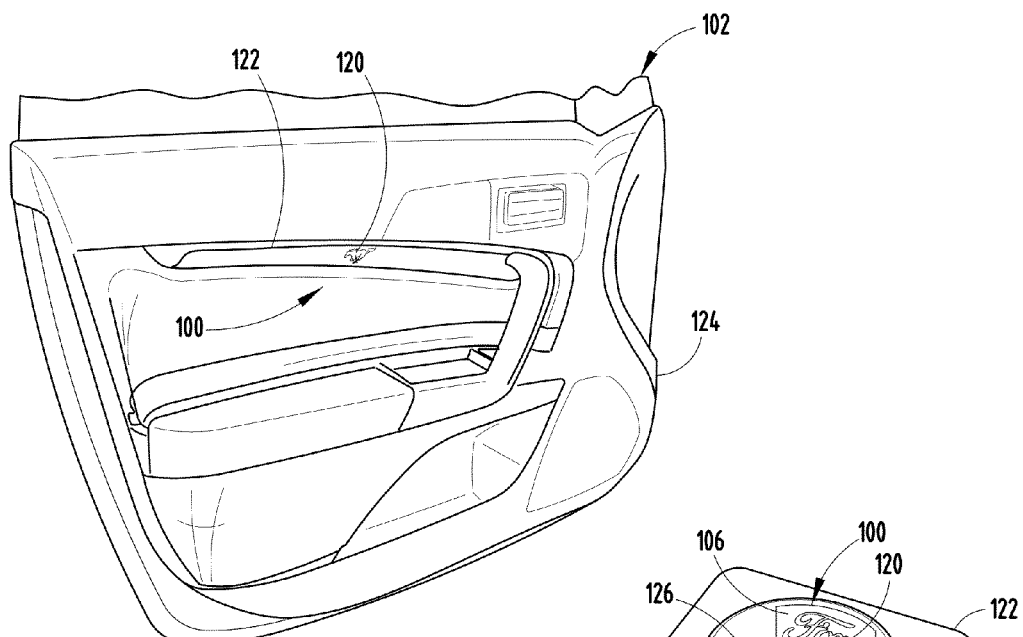
FIG. 2 is an environmental view of a light bar proximity switch, in accordance with one embodiment of the present invention.
Figure 3:
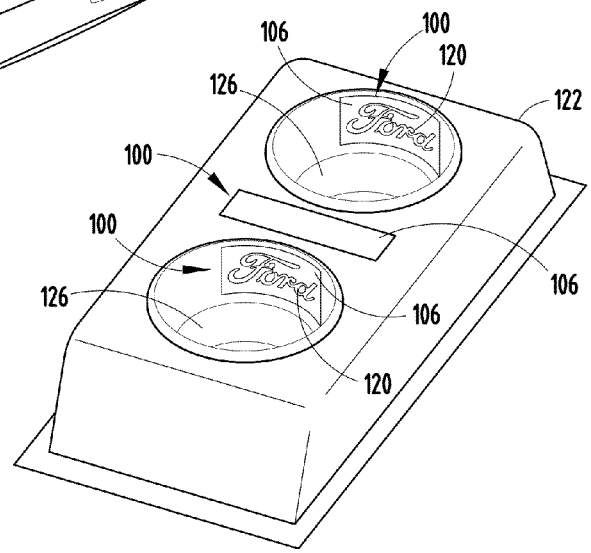
FIG. 3 is an environmental view of a light bar proximity switch, in accordance with one embodiment of the present invention.
Figure 4:
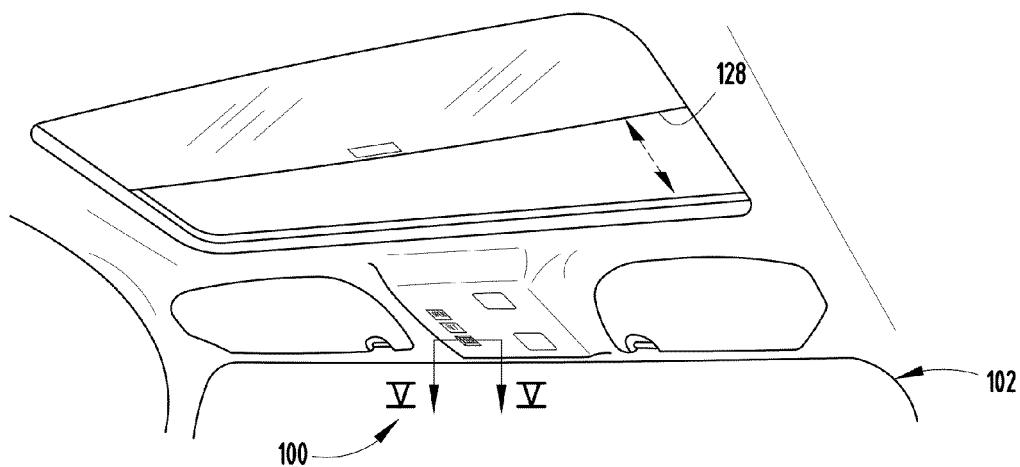
FIG. 4 is an environmental view of a light bar proximity switch, in accordance with one embodiment of the present invention.

With respect to FIGS. 1-6, a light bar proximity switch is generally shown at reference identifier 100. Typically, the light bar proximity switch 100 can be configured to operate a component of a vehicle, which is generally indicated at reference identifier 102 (FIGS. 2 and 4). The light bar proximity switch 100 can include a light pipe, generally indicated at reference identifier 104, wherein the light pipe 104 can include a first surface 106 and a second surface 108. Typically, the first surface 106 and second surface 108 define an area 110. An at least partially reflective surface 112 can be adjacent the second surface 108, and at least one circuit board 114 can be spaced from the light pipe 104 and the at least partially reflective surface 112. At least one proximity sensor 116 can be electrically connected to the circuit board 114, and at least one light source 118 can be configured to project light along the area 110. Typically, the emitted light can be reflected by the at least partially reflective surface 112 and viewed through the first surface 106, as described through greater detail herein.

By way of explanation and not limitation, the at least partially reflective surface 112 can be intermediate to the light bar 104 and the proximity sensors 116 so that the at least partially reflective surface 112 can reflect at least part of the light emitted by the light source 118 to increase the amount of light viewed through the first surface 106, while reducing the visibility of the proximity sensors 116 through the light pipe 104. Thus, the at least partially reflective surface can be opaque so that the visibility of the circuit board 114 and the proximity sensors 116 through the light pipe 104 can be reduced. According to one embodiment, the at least partially reflective surface 112 can be made of a paper material with a reflective coating. However, it should be appreciated by those skilled in the art that the at least partially reflective surface 112 can be made of additional or alternative suitable materials. Typically, the at least partially reflective surface 112 can be made of a material that reduces any adverse affect on a proximity field of the proximity sensors 116.

The at least partially reflective surface 112 can include at least one image, which can be viewed through the first surface 106 as a result of the light source 118 emitting light along the area 110. According to one embodiment, the image 120 can include, but is not limited to, text, a symbol, a picture, artwork, a logo, a drawing, the like, or a combination thereof. In such an embodiment, laser etching or printing on the first surface 106, while providing an additional element to limit the visibility of the proximity sensors 116 is unnecessary, and thus, a manufacturing step is eliminated.

According to one embodiment, the proximity sensors 116 can be capacitive sensors. However, it should be appreciated by those skilled in the art that other types of proximity sensors can be used in addition to or in an alternative to the capacitive sensors, which can include, but are not limited to, inductive sensors, optical sensors, resistive sensors, temperature sensors, the like, or a combination thereof. Exemplary proximity sensors are described in the April, 2009 ATMEL® Touch Sensors Design Guide, 10620D-AT42-04/09, the entire reference hereby being incorporated herein by reference.

Typically, the at least partially reflective surface has a surface area at least approximately equal to the surface area of the second surface 108, the circuit board 114, or a combination thereof. In such an embodiment, there can be adequate reflection of the light emitted by the light source 118, while continuing to reduce the visibility of the proximity sensors 116 in the circuit board 114.

According to one embodiment, the at least one light source is multi-colored, such that light having a plurality of hues is projected and viewed through the first surface 106. Typically, the light source 118 can be one or more light emitting diodes (LEDs). However, it should be appreciated by those skilled in the art that other suitable light sources can be utilized. There can be multiple light sources 118 that are each configured to emit a single hue, light sources 118 configured to emit a plurality of hues, or a combination thereof. Thus, the LED can be a plurality of red, green, and blue LEDs controlled to blend the emitted light, a red, green, blue (RGB) LED, LEDs configured to emit light having other hues, the like, or a combination thereof.

The light bar proximity switch 100 can be configured to have approximately uniform light distribution of the light viewed through the first surface 106. By way of explanation and not limitation, the uniform light distribution can be where there are light sources 118 optically connected to both ends of the light pipe 104 (as illustrated in phantom in FIG. 1), the first surface 106 can be altered to gradually increase the amount of light able to propagate there-through with respect to a distance from the light source 118, the at least partially reflective surface 112 can be altered to gradually increase the amount of light reflected with respect to a distance from the light source 118, the light pipe 104 or the light pipe 104 and the at least partially reflective surface 112 can have a non-uniform cross-section, or a combination thereof. It should be appreciated by those skilled in the art that a uniform light distribution can be achieved in other suitable manners. With respect to the above example where the first surface 106 is altered, this exemplary embodiment can include a non-transparent material (e.g., stippling or other microscopic alteration to the surface to deflect light) on a portion of the first surface 106 closest to the light source 118, wherein the amount of non-transparent material on the first surface 106 gradually reduces as the distance from the light source 118 increases.

In an embodiment that includes a multi-colored light source 118, continuously activating the proximity sensors 116 for a first time period can toggle through the multiple hues of the light source 118. Additionally or alternatively, the proximity sensors 116 can be configured to function as a slide switch, such that the direction of activation of the proximity sensors 116 is determined. Thus, a vehicle component controlled by the light bar proximity switch 100 can be the light source 118. Additionally or alternatively, as described in greater detail herein, the vehicle component can be, but is not limited to, a moon roof switch, a climate control device, a radio, another entertainment system, the like, or a combination thereof.

With respect to FIGS. 2 and 3, the light bar proximity switch 100 can be integrated into a console 122 of the vehicle 102. As exemplary illustrated in FIG. 2, the console 122 can be an interior side panel or a door panel 124. In another exemplary illustration of the console 122 including the light bar proximity switch 100 is illustrated in FIG. 3, wherein the console 122 is a cup holder 126, and the console 122 is a surface between the cup holders 126. It should be appreciated by those skilled in the art that the console 122 can be other interior or exterior surfaces on the vehicle.

Figure 5:
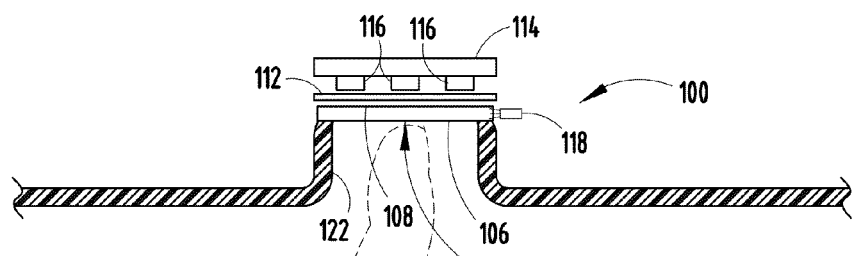
FIG. 5 is a cross-sectional view of the light bar proximity switch across line V-V of FIG. 4, in accordance with one embodiment of the present invention.

As exemplary illustrated in FIGS. 4 and 5, the light bar proximity switch 100 can be a capacitive moon roof switch. In such an embodiment, activation of the proximity sensor 116 can cause a moon roof 128 to move in an open or closed direction, or stop movement of the moon roof 116 based upon a control algorithm. The capacitive moon roof switch can also include the one or more light sources 118 that projects light along the area 110 of the light pipe 104, such that the emitted light is viewed through the first surface 106. An exemplary capacitive moon roof switch is described in U.S. Pat. No. 12/788,663, now U.S. Pat. No. 8,283,800 which issued on Oct. 9, 2012, entitled "VEHICLE CONTROL SYSTEM WITH PROXIMITY SWITCH AND METHOD THEREOF," the entire reference hereby being incorporated herein by reference.

It should be appreciated by those skilled in the art that the console 122 can be other surfaces within a vehicle 102. For purposes of explanation and not limitation, the console 122 can be a headliner, a dashboard, an interior panel, an exterior panel, a center console between a driver's seat and a passenger's seat, a console extending along a pillar of the vehicle 102, the like, or a combination thereof.

Figure 6:
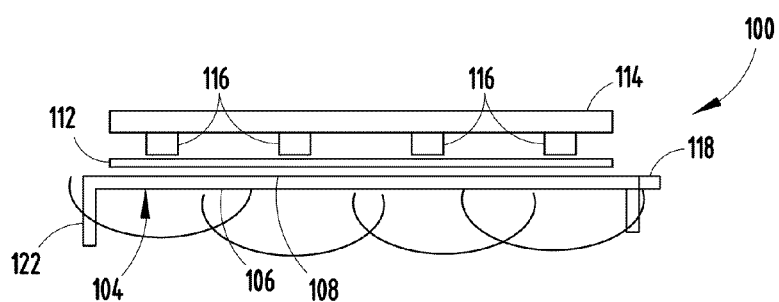
FIG. 6 is a schematic diagram of a light bar proximity switch, in accordance with one embodiment of the present invention.

With respect to FIG. 6, the light bar proximity switch 100 can include an array of proximity sensors 116. Typically, each of the proximity sensors 116 can emit a proximity field that forms to combine an activation field, such that a lateral distance of the activation field extends approximately parallel to the console 122 can be greater than a longitudinal direction of the activation field 110 extending approximately perpendicular to the console 122 surface. Thus, the activation field extends laterally to adequately cover the console 122, while not extending in a longitudinal direction to an undesirably great distance that can result in increased accidental activation and/or a reduction in sensitivity.

In any of the embodiments described herein, the light bar proximity switch 100 can include and/or be in communication with one or more controllers, one or more memory devices that store one or more executable software routines other suitable hardware circuitry, other suitable software, the like, or a combination thereof, such that activation of the proximity sensor 116 can be communicated to perform a function.

Advantageously, the light bar proximity switch 100 can increase the light viewed through the first surface 106 by including the reflective surface 112, while the reflective surface 112 minimizes the visibility of the proximity sensor 116 and can include an image for labeling the light bar proximity switch 100. Thus, an additional manufacturing step for laser etching or printing on the surface of the light bar 104 is not necessary and the durability of the image 120 is increased with respect to such laser etching or printing. It should be appreciated by those skilled in the art that the light bar proximity switch may include additional or alternative advantages. It should further be appreciated by those skilled in the art that the above-described components can be combined in additional or alternative ways not explicitly described herein.

It is to be understood that variations and modifications can be made on the aforementioned structure without departing from the concepts of the present invention, and further it is to be understood that such concepts are intended to be covered by the following claims unless these claims by their language expressly state otherwise.

We claim:

1. A light bar proximity switch comprising:
    a light pipe comprising:
        a first surface; and
        a second surface, wherein said first and second surfaces define an area;
    an at least partially reflective surface adjacent said second surface;
    at least one circuit board spaced from said light pipe and said at least partially reflective surface;
    at least one proximity sensor electrically connected to said at least one circuit board; and
    at least one light source configured to project light along said area, wherein said emitted light is reflected by said at least partially reflective surface and viewed through said first surface, and wherein the at least partially reflective surface is between the light pipe and the at least one proximity sensor.

2. The light bar proximity switch of claim 1, wherein said at least one proximity sensor is a capacitive sensor.

3. The light bar proximity switch of claim 1, wherein said at least partially reflective layer is opaque.

4. The light bar proximity switch of claim 1, wherein said at least partially reflective surface comprises at least one image, said image comprises at least one of:
    text;
    a symbol;
    a picture;
    artwork;
    a logo; and
    a drawing.

5. The light bar proximity switch of claim 1, wherein said at least partially reflective layer comprises a paper material.

6. The light bar proximity switch of claim 1, wherein said at least partially reflective surface has a surface area at least approximately equal to a surface area of at least one of said second surface and said at least one circuit board.

7. The light bar proximity switch of claim 1, wherein said at least one light source is configured to emit light having a plurality of hues.

8. The light bar proximity switch of claim 7, wherein continuously activating said at least one proximity sensor for a first time period toggles said at least one light source through said plurality of hues.

9. The light bar proximity switch of claim 1, wherein said at least one proximity sensor is a plurality of proximity sensors configured as a slide switch.

10. The light bar proximity switch of claim 1 integrated into a console of a vehicle.

11. A light bar proximity switch configured to operate a vehicle component, said proximity switch comprising:
    a light pipe comprising:
        a first surface; and
        a second surface, wherein said first and second surfaces define an area;
    an at least partially reflective surface adjacent said second surface, wherein said at least partially reflective surface comprises at least one image;
    at least one circuit board spaced from said light pipe and said at least partially reflective surface;
    at least one capacitive sensor electrically connected to said at least one circuit board; and
    at least one light source configured to project light having a plurality of hues along said area, wherein said emitted light is reflected by said at least partially reflective surface and viewed through said first surface, and wherein the at least partially reflective surface is between the light pipe and the at least one capacitive sensor.

12. The light bar proximity switch of claim 11, wherein said at least partially reflective layer is opaque.

13. The light bar proximity switch of claim 11, wherein said image comprises at least one of:
    text;
    a symbol;
    a picture;
    artwork;
    a logo; and
    a drawing.

14. The light bar proximity switch of claim 11, wherein said at least partially reflective surface comprises a paper material.

15. The light bar proximity switch of claim 11, wherein said at least partially reflective surface has a surface area at least approximately equal to a surface area of at least one of said second surface and said at least one circuit board.

16. The light bar proximity switch of claim 11, wherein continuously activating said at least one proximity sensor for a first time period toggles said at least one light source through said plurality of hues.

17. The light bar proximity switch of claim 11, wherein said at least one proximity sensor is a plurality of proximity sensors configured as a slide switch.

18. The light bar proximity switch of claim 11 integrated into a console of a vehicle.

19. A light bar proximity switch integrated in a vehicle comprising:
    a light pipe;
    an at least partially reflective surface comprising an image and adjacent said light pipe;
    at least one capacitive sensor spaced from said light pipe behind the at least partially reflective surface; and
    at least one light source to project light having a plurality of hues that is reflected by said at least partially reflective surface and viewed through said light pipe.

20. The light bar proximity switch of claim 19, wherein said image comprises at least one of:
    text;
    a symbol;
    a picture;
    artwork;
    a logo; and
    a drawing.

21. A light bar proximity switch comprising:
    a light pipe;
    a proximity sensor;
    a reflective surface disposed between the light pipe and the proximity sensor and covering the proximity sensor; and
    a light source coupled to the light pipe to project light into the light pipe, wherein said light is reflected by the reflective surface.

22. The light bar proximity switch of claim 21 further comprising an image disposed on the reflective surface.

* * * * *